(12) United States Patent
Duvall et al.

(10) Patent No.: US 6,764,759 B2
(45) Date of Patent: Jul. 20, 2004

(54) METHOD OF FORMING A PHASE CHANGE THERMAL INTERFACE

(75) Inventors: James H. Duvall, Mentor, OH (US); Steve Bergerson, Milford, CT (US); Charles Balian, Guilford, CT (US); Arthur H. Rogove, South Glastonbury, CT (US)

(73) Assignee: Saint-Gobain Performance Plastics Corporation, Wayne, NJ (US)

(*) Notice: Subject to any disclaimer, the term of this patent is extended or adjusted under 35 U.S.C. 154(b) by 28 days.

(21) Appl. No.: 10/123,324

(22) Filed: Apr. 16, 2002

(65) Prior Publication Data

US 2003/0039825 A1 Feb. 27, 2003

Related U.S. Application Data

(62) Division of application No. 09/482,590, filed on Jan. 13, 2000, now Pat. No. 6,391,442.
(60) Provisional application No. 60/142,751, filed on Jul. 19, 1999.

(51) Int. Cl.[7] .................................................. B32B 7/12
(52) U.S. Cl. ........................ 428/348; 428/349; 428/354; 428/355 R; 428/402; 428/403; 428/407; 428/920; 427/221; 427/218
(58) Field of Search .............................. 428/348, 349, 428/354, 355 R, 402, 403, 407, 920; 427/221, 218

(56) References Cited

U.S. PATENT DOCUMENTS

| | | | | |
|---|---|---|---|---|
| 4,299,715 A | * | 11/1981 | Whitfield et al. |
| 4,487,856 A | * | 12/1984 | Anderson et al. |
| 4,685,987 A | * | 8/1987 | Fick |
| 4,722,960 A | * | 2/1988 | Dunn et al. |
| 4,729,060 A | * | 3/1988 | Yamamoto et al. |
| 4,879,632 A | * | 11/1989 | Yamamoto et al. |
| 4,915,167 A | * | 4/1990 | Altoz |
| 5,290,624 A | * | 3/1994 | Bujard |
| 5,302,344 A | * | 4/1994 | Perlman |
| 5,679,457 A | | 10/1997 | Bergerson |

(List continued on next page.)

FOREIGN PATENT DOCUMENTS

| | | |
|---|---|---|
| EP | 0 813 244 A2 | 6/1997 |
| EP | 1 067 164 A1 | 7/2000 |
| JP | 1-248551 A | 10/1989 |
| JP | 1-248551 | * 10/1989 |
| WO | WO 97/41599 | 11/1997 |
| WO | WO 99/19909 | 4/1999 |

OTHER PUBLICATIONS

"Packaging ideas", Electronic Packaging & Production, Sep. 1, 1995, p. 32.*

R.C.Miller, "Structure for Achieving Thermal Enhancement in a semiconductor Package", IBM Technical Disclosure Bulletin, vol. 23, No. 6, Nov. 1980, p. 2308.*

"Thermal Sponge", IBM Technical Disclosure Bulletin, vol. 29, No. 11, Apr. 1987, pp. 4950–4951.*

(List continued on next page.)

*Primary Examiner*—Duc Truong
(74) *Attorney, Agent, or Firm*—Fay, Sharpe, Fagan, Minnich & McKee, LLP (57) ABSTRACT

A thermal interface material (A) transfers heat from a heat source (12), such as a microprocessor, to a heat sink (14) for maintaining the microprocessor at a safe operating temperature. The interface material includes thermally conductive filler particles dispersed in a phase change material. The phase change material softens and flows at the operating temperature of the heat source, thereby providing good thermal contact with uneven surfaces of the heat source and heat sink, without excessive exudation and loss of the interface material. The phase change material includes a polymer component, such as an elastomer, and a melting point component, which adjusts the softening temperature of the phase change material to the operating temperature of the heat source.

19 Claims, 4 Drawing Sheets

U.S. PATENT DOCUMENTS

| | | | | |
|---|---|---|---|---|
| 5,737,187 | A | * | 4/1998 | Nguyen et al. |
| 5,770,318 | A | * | 6/1998 | Friedman |
| 5,783,862 | A | * | 7/1998 | Deeney |
| 5,901,040 | A | * | 5/1999 | Cromwell et al. |
| 5,904,796 | A | * | 5/1999 | Freuler et al. |
| 5,930,115 | A | * | 7/1999 | Tracy et al. |
| 6,054,198 | A | * | 4/2000 | Bunyan et al. |
| 6,391,442 | B1 | * | 5/2002 | Duvall et al. |

OTHER PUBLICATIONS

C. Biber, "Choosing a Heat sink Some tips and Recommendations", EDN, Oct 12, 1995, pp. 125–133.*

J.G. Ameen et al, "Dealing with the heat", Circuits & Devices, Jul. 1998, pp. 38–40.*

R.J. Dombrowskas et al, "Conduction cooled Chip Module", IBM Technical Disclosure Bulletin, vol. 14, No. 9, Feb. 1972, p. 2689.*

"Packaging Ideas", *Electronic Packaging & Production*, Sep. 1, 1995, p. 32.

R.C. Miller, "Structure for Achieving Thermal Enhancement in a Semiconductor Package," *IBM Technical Disclosure Bulletin*, vol. 23, No. 6, Nov. 1980, p. 2308.

"Thermal Sponge," *IBM Technical Disclosure Bulletin*, vol. 29, No. 11, Apr. 1987, pp. 4950–4951.

C. Biber, "Choosing a Heat Sink: Some Tips and Recommendations," *EDN*, Oct. 12, 1995, pp. 125–133.

J.G. Ameen, et al. "Dealing with the Heat," *Circuits & Devices*, Jul. 1998, pp. 38–40.

R.J. Dombrowskas, et al., "Conduction Cooled Chip Module," *IBM Technical Disclosure Bulletin*, vol. 14, No. 9, Feb. 1972, p. 2689.

* cited by examiner

METHOD OF FORMING A PHASE CHANGE THERMAL INTERFACE

This application claims the priority of U.S. Provisional Application Ser. No. 60/142,751, filed Jul. 8, 1999 and is a division of Application Ser. No. 09/482,590, filed Jan. 13, 2000 now U.S. Pat. No. 6,391,442.

BACKGROUND OF THE INVENTION

This invention pertains to thermally conductive materials, and more particularly, to a thermally conductive interface material for heat generating devices, such as microprocessor power supply assemblies, that facilitates heat transfer from the heat generating device to a heat sink.

With increasing market pressure for smaller, faster, and more sophisticated end products using integrated circuits, the electronics industry has responded by developing integrated circuits which occupy less volume, yet operate at high current densities. Power supply assemblies for such microprocessors generate considerable heat during operation. If the heat is not adequately removed, the increased temperatures generated by the power supply assemblies will result in damage to the semiconductor components.

A heat sink is commonly used to transfer the heat away from the power supply or other heat generating assembly. The heat sink generally includes a plate or body formed from a conductive metal, which is maintained in thermal contact with the assembly for dissipating heat in an efficient manner. Fins optionally protrude from the plate for providing an increased surface area for heat dissipation to the surrounding environment.

The current industry technique for providing thermal contact between a microprocessor power supply assembly and a heat sink is to interpose a thermal interface material between the two, which facilitates heat transfer from the active device to the heat sink.

One method is to apply a ceramic filled thermal grease, which is typically silicone based, between the heat sink and the power supply. Thermal greases provide excellent thermal properties, but require an extensive assembly process with high manufacturing cost. The product is usually applied by hand, from a syringe, or with an aluminum carrier. This process is labor intensive and slow and does not lend itself to automation.

Another method for providing a conductive interface includes the use of thermally conductive wax compounds. These compounds, however, are generally brittle at ambient temperatures and easily chipped off, resulting in a high thermal resistance. The low viscosity of the wax at operating temperature causes the wax to flow out from between the active component and the heat sink, resulting in a high thermal resistance. Further, because of the brittle nature of the wax compounds, they are difficult to manufacture and apply to a heat sink.

Thermally conductive silicone rubbers have also been used as conductive interfaces. Although soft and pliable, the silicone rubber requires relatively high pressure and a long warm-up time to attain a low thermal resistance. The rubbers have poor flow characteristics which result in a low thermal conduction when there is a mismatch of flatness between the heat sink and the heat producing device. Differences in the thermal coefficient of expansion between the silicone rubber and the heat sink can result in high thermal resistance during temperature cycling. These effects lead to a poor thermal conductivity from the heat producing device to the heat sink.

Other thermal interfaces employ polymeric thermally conductive cure-in-place compounds. These compounds are generally rigid after cure. They have a poor reliability because of a difference in thermal coefficient of expansion between the material and the heat sink, causing cracks and failure during temperature cycling. The polymeric materials are labor intensive to apply and require long cure times.

The present invention provides for a new and improved thermal interface which overcomes the above-referenced problems and others.

SUMMARY OF THE INVENTION

The present invention relates to a thermal interface material which can be easily pre-attached to a microprocessor power assembly or a heat sink prior to shipment.

In accordance with one aspect of the present invention, a thermal interface material, which undergoes a phase change at microprocessor operating temperatures to transfer heat generated by a heat source to a heat sink, is provided. The thermal interface material includes a phase change substance, which softens at about the operating temperature of the heat source. The phase change substance includes a polymer component and a melting point component. The melting point component modifies the temperature at which the phase change substance softens. The thermal interface material further includes a thermally conductive filler dispersed within the phase change substance.

In accordance with another aspect of the present invention, a multi-layer strip is provided. The strip includes a layer of a thermal interface material for thermally connecting a heat source with a heat sink. The thermal interface material includes a polymer component, a melting point component in sufficient quantity to adjust the softening temperature of the interface material to about the operating temperature of the heat source, and a thermally conductive filler mixed with the melting point component and the polymer component. The strip further includes an outer layer disposed on a side of the thermal interface material. The outer layer includes at least one of a protective releasable liner and a layer of an adhesive material.

In accordance with another aspect of the present invention, a method of providing a thermal interface between a heat source and a heat sink is provided. The method includes interposing a thermal interface material between the heat source and heat sink, which softens at about the operating temperature of the heat source to provide a thermal interface between the heat source and the heat sink during operation of the heat source. The thermal interface material includes a polymer component, a melting component for modifying the temperature at which the thermal interface material softens, and a thermally conductive filler mixed with the polymer component and the melting point component.

One advantage of the present invention is that the thermal interface material can be pre-attached to a heat sink prior to shipment.

Another advantage of the present invention is that the cohesive strength and integrity of the thermal interface material provide for easy handling.

Still another advantage of the present invention is that the thermal performance of the thermal interface material matches that of thermal grease in a solid film form.

Still another advantage of the present invention is that a phase change or softening at the operating temperatures maximizes interfacial surface wetting.

Still another advantage of the present invention is that low application pressure without added heat allows for hand mounting during field rework and processor upgrades.

Still another advantage of the present invention is that the assembly process associated with thermal grease is eliminated but an equivalent thermal performance is maintained.

Still another advantage of the present invention system assembly cost is minimized by allowing for pre-attachment to a heat sink or CPU.

Still another advantage of the present invention is that the material softens and conforms to surface roughness or concavity at operating temperature.

Still another advantage of the present invention is that the material operates at low clip pressures (5 to 10 psi).

Still another advantage of the present invention is that the material can be applied and repositioned with thumb pressure allowing for easy field service.

Still another advantage of the present invention is that the material allows for vertical mounting due to its cohesive properties.

Still other benefits and advantages of the invention will become apparent to those skilled in the art upon a reading and understanding of the following detailed specification.

BRIEF DESCRIPTION OF THE FIGURES

The invention may take form in various components and arrangements of components, and in various steps and arrangements of steps. The drawings are only for purposes of illustrating a preferred embodiment and are not to be construed as limiting the invention.

DESCRIPTION OF THE PREFERRED EMBODIMENTS

Figure 1:
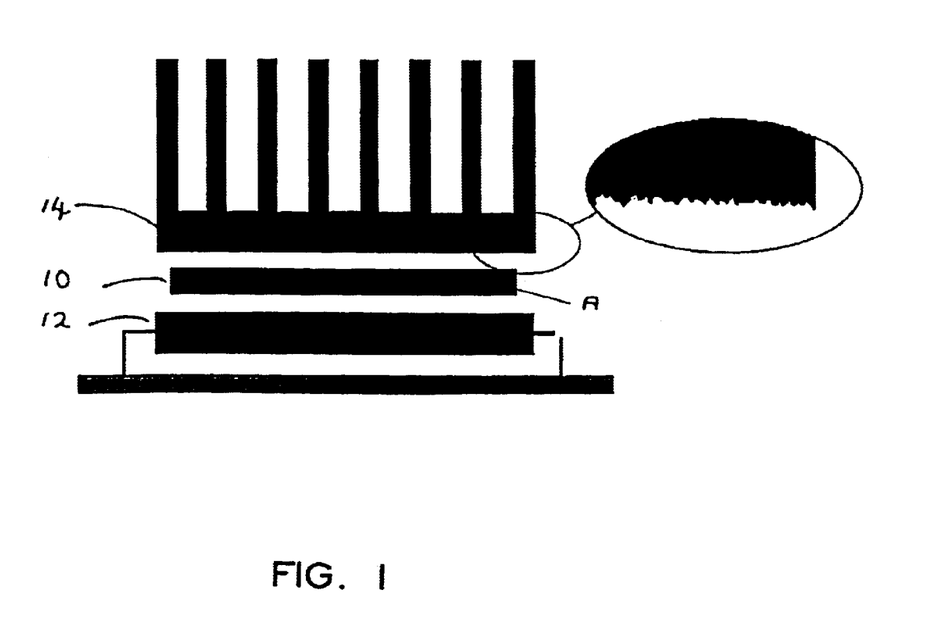
FIG. 1 is a schematic view of a heat sink, heat source, and intermediate thermally conducting film prior to assembly, according to the present invention.

With reference to FIG. 1, a thermally conductive, interface material A in the form of a film or layer 10 provides a thermal interface between an active device or heat source 12, such as a microprocessor power supply assembly, and a heat sink 14, such as a block of heat transmissive material, to facilitate heat transfer from the device 12 to the heat sink 14. It will be appreciated that the heat source or device 12 can be any type of semiconductor device or power supply assembly that generates excess heat in its operation, which heat if not removed, may damage the device or impair operation of the device.

The film 10 is preferably of from about 0.025 to 2.5 millimeters in thickness. The film thickness can be further increased, if desired, to accommodate certain application requirements, such as larger spacing characteristics in electronics or power supply cooling application.

The interface material A consists of a mixture of a phase change substance and a thermally conductive filler. The interface material A has a sufficient cohesive strength to allow handling in a roll form or as pre-cut pieces. The design of the product allows the use of die-cut parts mounted to a bandoleer web to supply continuous parts to a manual or automated part dispensing or "pick and place" part application process.

Figure 2:
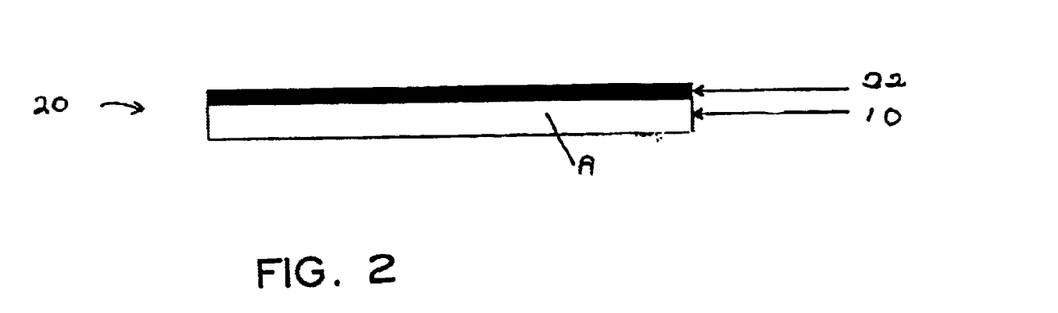
FIG. 2 is a side sectional view of a first embodiment of a multi-layer strip comprising the film of FIG. 1.
Figure 3:
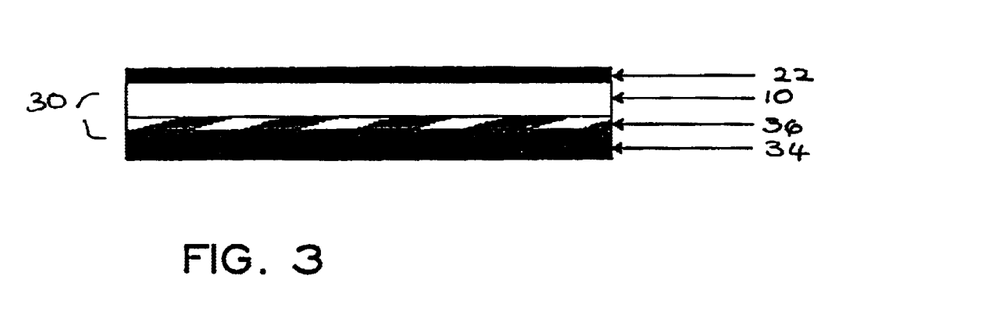
FIG. 3 is a side sectional view of a second embodiment of a multi-layer strip.
Figure 4:
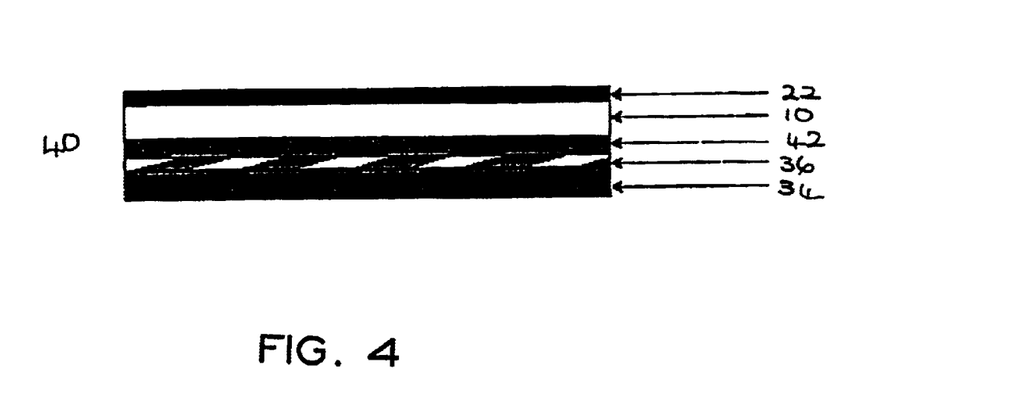
FIG. 4 is a side sectional view of a further embodiment of a multi-layer strip.

With reference also to FIGS. 2–4, the material A is preferably supplied in the form of a multi-layer strip in which the film 10 of the interface material is sandwiched between layers of adhesive and/or releasable protective liners. FIG. 2 shows a first embodiment of a multi-layer strip 20 in which a protective liner 22 is supplied on one or more sides of the film 10 of thermally conductive material A. The protective liner preferably comprises a coated substrate, such as SCK polyethylene-coated paper (e.g. PN 907826, 20", or 909785, 24"), polyethylene or polyester film, coated with a release coating, such as a polydimethyl siloxane, fluorosilicone, or non-silicone release coating. Examples of such laminates include blue poly 2.5 mil 2S PN 9099037. One or both sides of the liner substrate may be coated with release coating as desired. The protective liner protects the film of thermally conductive material against damage prior to application to the heat sink or active device. The liner 22 is peeled off prior to use.

With reference to FIG. 3, a second embodiment of a multi-layer strip 30 includes first and second liner layers 22 and 34 which form the outermost layers of the strip 30. Intermediate between the film 10 of thermally conductive material and one or more of the protective layers 34 is a layer of adhesive 36 to aid in attachment of the film to the heat sink 14 or power supply assembly 12. The adhesive is preferably a pressure sensitive adhesive, which permits the thermally conductive film to be attached to a heat sink or to a power supply with minimal pressure, typically less than 10 psi, and without the need for heat. Where the adhesive is not employed, the thermally conductive film 10 is applied to the heat sink or to the power supply by providing a small amount of heat to the layer.

With reference to FIG. 4, a third embodiment of a multi-layer strip 40 includes a reinforcement layer 42 between the thermally conductive film 10 and adhesive layer 36. The reinforcement layer is provided to improve the mechanical strength of the film. The reinforcement layer may include a polymeric film, woven or non-woven cloth, such as glass cloth (formed from fiberglass), or a metallic film, such as aluminum. Alternatively, reinforcement materials, such as fibers or woven cloth, may be embedded in the thermally conductive film 10 itself.

It should be readily appreciated that other configurations of the multi-layer strip are also possible depending on whether the film 10 is to be attached to one or the other or both of the heat sink 14 and the microprocessor 12 prior to their shipment, and whether the attachment is to take place in the field, where heat for joining the film to the two parts, 12, 14, is not readily available, and thus an adhesive layer, or layers, is desired. For example, if the strip is to be attached to both parts 12, 14, in the field, the strip may include two layers of adhesive, one for attaching the film to the heat sink, the other for attaching the film to the power assembly.

Figure 5:
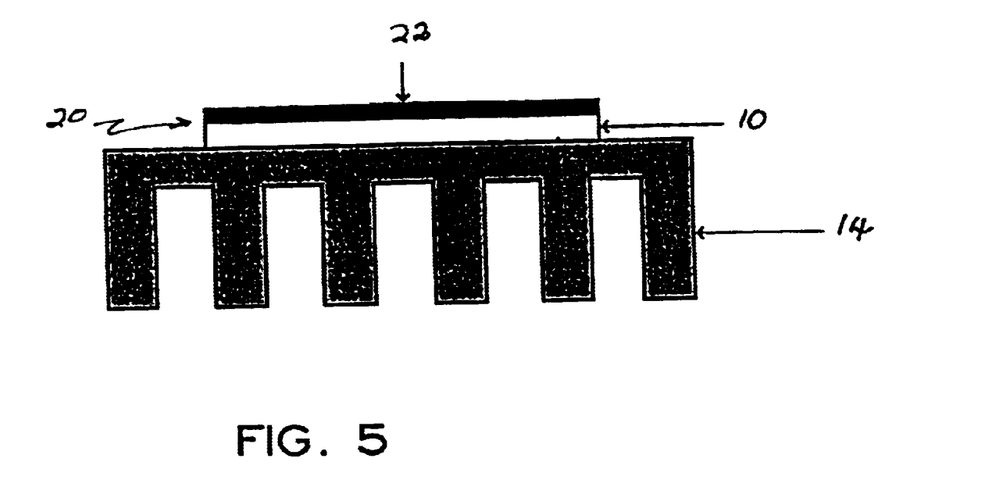
FIG. 5 is a schematic side sectional view of a heat sink with the multi-layer strip of FIG. 2 attached.

With reference to FIG. 5, a multi-layer strip 20 of the type illustrated in FIG. 2 is shown mounted to a heat sink (e.g., by application of pressure and/or heat). The protective layer 22 remains in place until it is desired to attach the heat sink to a microprocessor 12 (or to a power transistor or other heat-generating device).

Figure 6:
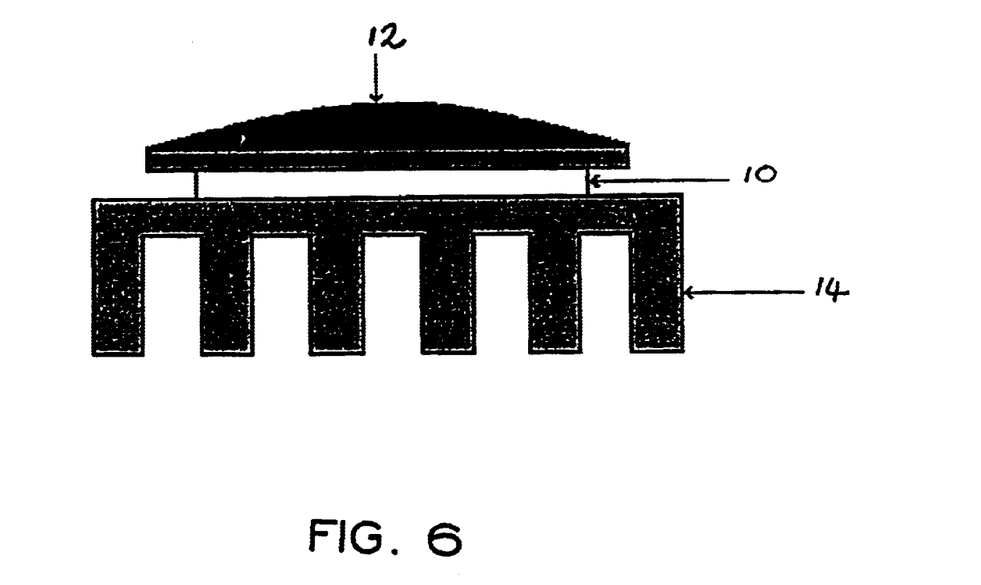
FIG. 6 is a side sectional view of the heat sink, heat source and attached thermally conducting film of FIG. 1.

With reference now to FIG. 6, the protective layer 22 has been removed from the multi-layer strip, and the exposed side of the thermally conductive film 10 has been attached to the microprocessor 12.

During use, the heat generated by the microprocessor warms the thermally conductive film 10. The film undergoes a softening or phase change at or just below the operating temperature of the microprocessor, allowing wet-out of the heat sink and microprocessor surfaces by the thermally conductive material A. This results in the elimination of thermally insulating air pockets. After initial wetting, the material A proceeds to transfer the heat generated by the microprocessor 12 to the heat sink 14.

The thermal performance of the thermally conductive film 10 matches that of ceramic filled greases commonly used in the industry. However, the film retains a relatively high melt viscosity to eliminate excessive flow and dripping from vertically mounted assemblies. During thermal cycling (on/off switching of the heat generating device 12) the film 10 maintains interfacial contact and excellent thermal performance.

The specific formulation of the film 10 is preferably selected according to the conditions to which the film is to be exposed (e.g., operating temperature, temperature cycling characteristics, and the like). This allows customized adjustment and control for viscosity, thermal conductivity, and heat melt/flow properties to allow precise performance matching to various applications or requirements.

The film material A is composed of two elements, namely, a thermally conductive filler and a phase change material. The phase change material is a substance or mixture that undergoes a phase change at, or just below, a selected operating temperature. The thermally conductive filler increases the thermal conductivity of the phase change material and is preferably selected from a variety of materials having a bulk thermal conductivity of between about 0.5 and 1000.0 Watts/meter-K as measured according to ASTM D1530. Examples of suitable conductive fillers include, but are not limited to, boron nitride, aluminum oxide, nickel powder, copper flakes, graphite powder, powdered diamond, and the like. Preferably, the particle size of the filler, the particle size distribution, and filler loading (concentration in the film) are selected to maximize packing and thus produce the most efficient thermal conductance. Preferably, the particle size of the filler is between about 2 and 100 microns.

The phase change substance is a mixture of two or more compatible components or materials that undergoes a reversible solid-liquid phase change at the operating temperature of the heating device. The viscosity of the phase change substance at the melting temperature is low enough to completely wet-out the heat sink/power device interface but high enough to prevent exudation and loss of contact. The viscosity of the phase change substance at the operating temperature of the microprocessor or power supply assemblies (typically operating in a temperature range from 50° C. to 100° C.) is preferably between 1 and 100 poise and more preferably from 5–50 poise. More preferably, the phase change substance maintains a viscosity of between 5 and 50 poise over the temperature range of 60–120° C. and has a melting point in the range of 30–120° C.

When cooled below its melting point, the phase change substance solidifies without a significant change in volume, thereby maintaining intimate contact between the heat sink 14 and the power device 12.

The first component of the phase change substance is a polymer component which includes a polymer. Suitable polymers include single or multi-component elastomers, consisting of one or more of the following: silicone, acrylic, natural rubber, synthetic rubber, or other appropriate elastomeric materials. Examples of such elastomers include styrene butadiene rubbers, both di-block and tri-block elastomers (e.g., Kraton® from Shell Chemicals), nitrile, natural rubber, polyester resins, combinations thereof, and the like, where the Mooney viscosity can range up to 40 ML4. Examples of suitable acrylic polymers include Aeroset 1085, Aeroset 414, Aeroset 1845, Aeroset 1081, and Aeroset 1452, obtainable from Ashland Chemicals.

The second component of the phase change substance is a melting point component. This component influences the melting point of the phase change substance for achieving a melting point of the film at around the operating temperature. Examples of suitable melting point components include $C_{12}$–$C_{16}$ alcohols, acids, esters, and waxes, low molecular weight styrenes, methyl triphenyl silane materials, combinations thereof, and the like. Suitable $C_{12}$—$C_{12}$–$C_{16}$ acids and alcohols include myristyl alcohol, cetyl alcohol, stearyl alcohol, myristyl acid, and stearic acid. Preferred waxes include microcrystalline wax, paraffin waxes, and other wax-like compounds, such as cyclopentane, heceicosyl; 2-heptadecanone; pentacosaneyl; silicic acid, tetraphenyl ester; octadecanoic acid; 2-[2-[2-(2hydroxyethoxy) ethoxy] ethoxy] ethyl ester; cyclohexane, docosyl; polystyrene; polyamide resins; disiloxane 1,1,1, trimethyl-3,3; and triphenyl silane.

The polymer component provides the phase change material with body (viscosity) to prevent the melting point component and filler from flowing out from between the heat sink and the microprocessor heat source. It thus acts as a viscosity controller. It also provides the film 10 with flexibility, handleability, and other film forming characteristics at ambient temperatures. Without the polymer component present, the melting point component would be brittle and tend to fracture and disintegrate at room temperature.

The melting point component melts at around the operating temperature and dissolves the polymer component in the melting point component. The viscosity of the liquefied melting point component drops as the polymer component dissolves in it. The resulting viscosity is sufficient for the material A to flow and wet the adjacent surfaces of the heat sink 14 and microprocessor heat source 12, creating thermal conduction paths and excellent thermal contact. Surface discontinuities in the heat sink and microprocessor heat source are filled with the material A. However, the viscosity is not so low that the material A flows out from between the parts 12, 14. To ensure that the thermal interface material has a relatively broad melting point, yet does not flow too readily at room temperatures, a combination of melting point components having differing melting points may be employed. For example, a combination of a $C_{16}$ component, such as cetyl alcohol, with a $C_{14}$ component, such as myristyl alcohol, yields a thermal interface material with good handling properties.

Preferably, the solubility parameter (δ) of the polymer component is within +1 and −1 of the solubility parameter(s) of the melting point, wax like component(s). This provides a level of compatibility between the liquefiable components.

Preferably, the material A comprises:
1) from 10–80% polymer, more preferably 10–70%, most preferably from about 15 to about 50% polymer by weight;
2) from 10–80% filler, more preferably 10–70%, most preferably, from about 15 to about 60% filler by weight; and 3) from 10–80% melting point component, more preferably 15–70%, most preferably, from about 20% to about 60% melting point component by weight.

The material A may also contain other ingredients, such as colorants, e.g., for identifying the particular properties of the material; antioxidants, for improving storage properties; wetting agents, for improving contact with microprocessor components, and the like.

To prepare the films 10, the components of the phase change material (polymer component and melting point component) are mixed with the filler. To improve the spreading characteristics of the material A, a processing aid, such as a solvent may be added to the mixture. Suitable solvents include low boiling aromatic and aliphatic compounds, such as toluene, benzene, xylene, heptane, mineral spirits, ketones, esters, alcohols, such as isopropyl alcohol, and mixtures thereof. A particularly preferred solvent is toluene, or a mixture of toluene and isopropyl alcohol. The isopropyl alcohol assists in dissolving the melting point component in the mixture.

The mixture is heated to about 50° C. to disperse the components and then dried to form the film 10 on one of the release liners 22. During this stage, the solvent evaporates. Optionally, a reinforcing layer 42 is then laminated to the thermal interface material. Alternatively, reinforcing materials, such as fibers, may be mixed with the thermal interface material prior to drying the film on the release liner.

One or more layers of adhesive are then optionally applied to the film 10 (or to the reinforcing layer) and a second release liner applied to the adhesive. Alternatively, the film is applied directly to a microprocessor power assembly or heat sink.

Suitable adhesives for the adhesive layer include Dow PSA adhesives 750D1 and 6574 and Ashland 414. The adhesive may be coated to a thickness of about 0.0002–0.0004 inches.

In another alternative embodiment, the adhesive is first applied to the second release liner. The release liner with the film and the release liner with the adhesive are then sandwiched together, optionally with application of heat, to bond the adhesive layer to the thermal interface material. A reinforcing material 42, such as glass cloth, may be laminated to the adhesive layer or to the thermal interface material, prior to sandwiching the adhesive layer and thermal interface material together.

The multi-layer strip thus formed may be supplied on a reel or sectioned into suitably sized pieces.

While not intending to limit the scope of the invention, the following examples provide suitable compositions for the thermal interface material A and the properties thereof.

EXAMPLES

In the following examples, components were obtained, as follows:

Melting Point Components:

Myristyl alcohol (a $C_{14}$ alcohol), cetyl alcohol (a $C_{16}$ alcohol, sold under the tradename Lorol $C_{16}$), stearyl alcohol, myristyl acid, and stearic acid were obtained from Aldrich Chemical or Henkel Chemicals.

Petroleum waxes were obtained from Bareco, including Bareco SC4095, Bareco SC5050, Bareco 5051, Bareco 6513, and Ultraflex.

Low melting aromatic hydrocarbons were obtained from Hercules, such as Piccolastic A-50, A-25, and A75.

Polymer Components:

Several acrylic polymers were obtained from Ashland Chemical including Aeroset 1845, Aeroset 1085, Aeroset 1081, Aeroset 414, and Aeroset 1452.

Natural Rubber was obtained.

A di-block copolymer of styrene and butadiene was obtained from Shell Chemical.

Di-block copolymers of styrene and EP rubber were obtained from Shell, such as Kraton 1107, 1102, 1652.

Low melting point aromatic hydrocarbon resins were obtained from Hercules, such as Piccolite A50.

Filler Materials:

Boron Nitride was obtained from Advanced Ceramics. Alumina ($Al_2O_3$) was obtained from Alcoa Aluminum.

Other Additives

Irganox 330, and Irganox 1010, both antioxidants, were obtained from Ciba Geigy.

A wetting agent, KR38S, was obtained from Kendrich.

Pigments were added in some examples for aesthetic purposes.

Example 1

To prepare a thermal interface material A, Aeroset 1845, myristyl acid, and boron nitride were combined in a mixture with toluene in the following amounts:

| Ingredient | Weight % | Purpose of the Mixture |
| --- | --- | --- |
| Aeroset 1845 | 40 | polymer component |
| Boron Nitride Powder | 20 | filler material |
| Myristyl Acid | 20 | melting point component |
| Toluene | 20 | solvent |

This mixture was heated to 500 and mixed until homogeneous. The mixture was then dried at 100° C. for 5 minutes on a release liner to form a film 10. The dry thickness of the film (measured after removal of the release liner) was 0.00511 (0.127 mm), as were the films of Examples 2–17 below.

Example 2

To prepare a thermal interface material, Aeroset 414, myristyl acid, and boron nitride were combined in a mixture with toluene in the following amounts:

| Ingredient | Weight % | Purpose of the Mixture |
| --- | --- | --- |
| Aeroset 414 | 40 | polymer component |
| Boron Nitride Powder | 20 | filler material |
| Myristyl Acid | 20 | melting point component |
| Toluene | 20 | solvent |

This mixture was heated, coated and dried on a release liner, using the method of Example 1.

Example 3

Aeroset 1085, myristyl acid, and boron nitride were combined in a mixture with toluene in the following amounts:

| Ingredient | Weight % | Purpose of the Mixture |
| --- | --- | --- |
| Aeroset 1085 | 40 | polymer component |
| Boron Nitride Powder | 20 | filler material |
| Myristyl Acid | 20 | melting point component |
| Toluene | 20 | solvent |

This mixture was heated, coated and dried on a release liner, using the method of Example 1.

Example 4

Aeroset 1845, myristyl acid, and alumina were combined in a mixture with toluene in the following amounts:

| Ingredient | Weight % | Purpose of the Mixture |
| --- | --- | --- |
| Aeroset 1845 | 40 | polymer component |
| Alumina Powder | 20 | filler material |
| Myristyl Acid | 20 | melting point component |
| Toluene | 20 | solvent |

This mixture was heated, coated and dried on a release liner, using the method of Example 1.

Example 5

Aeroset 1845, cetyl alcohol, and boron nitride were combined in a mixture with toluene in the following amounts:

| Ingredient | Weight % | Purpose of the Mixture |
| --- | --- | --- |
| Aeroset 1845 | 40 | polymer component |
| Boron Nitride Powder | 20 | filler material |
| Cetyl alcohol | 20 | melting point component |
| Toluene | 20 | solvent |

This mixture was heated, coated and dried on a release liner, using the method of Example 1.

Example 6

Aeroset 1845, myristyl alcohol, and boron nitride were combined in a mixture with toluene in the following amounts:

| Ingredient | Weight % | Purpose of the Mixture |
| --- | --- | --- |
| Aeroset 1845 | 40 | polymer component |
| Boron Nitride Powder | 20 | filler material |
| Myristyl alcohol | 20 | melting point component |
| Toluene | 20 | solvent |

This mixture was heated, coated and dried on a release liner, using the method of Example 1.

Example 7

Aeroset 1845, stearyl alcohol, and boron nitride were combined in a mixture with toluene in the following amounts:

| Ingredient | Weight % | Purpose of the Mixture |
| --- | --- | --- |
| Aeroset 1845 | 40 | polymer component |
| Boron Nitride Powder | 20 | filler material |
| Stearyl alcohol | 20 | melting point component |
| Toluene | 20 | solvent |

This mixture was heated, coated and dried on a release liner, using the method of Example 1.

Example 8

Aeroset 1081, myristyl acid, and boron nitride were combined in a mixture with toluene at the ratios:

| Ingredient | Weight % | Purpose of the Mixture |
| --- | --- | --- |
| Aeroset 1081 | 40 | polymer component |
| Boron Nitride Powder | 20 | filler material |
| Myristyl Acid | 20 | melting point component |
| Toluene | 20 | solvent |

This mixture was heated, coated and dried on a release liner, using the method of Example 1.

Example 9

Natural rubber, Bareco SC5050, Piccolastic A50, and boron nitride powder were combined with toluene in the following amounts:

| Ingredient | Weight % | Purpose of the Mixture |
| --- | --- | --- |
| Natural rubber | 10 | polymer component |
| Boron Nitride Powder | 30 | filler material |
| Bareco SC 5050 | 20 | melting point component |
| Toluene | 30 | solvent |
| Piccolastic A50 | 10 | melting point component |

This mixture was heated, coated and dried on a release liner, using the method of Example 1.

Example 10

Natural rubber, Bareco SC5050, Piccolastic A50, and boron nitride powder were combined with toluene as follows:

| Ingredient | Weight % | Purpose of the Mixture |
| --- | --- | --- |
| Natural rubber | 20 | polymer component |
| Boron Nitride Powder | 10 | filler material |
| Bareco SC5050 | 20 | melting point component |
| Toluene | 30 | solvent |
| Piccolastic A50 | 20 | melting point component |

This mixture was heated, coated and dried on a release liner, using the method of Example 1.

Example 11

Natural rubber, Bareco SC5050, Piccolastic A25, and boron nitride powder were combined with toluene, as follows:

| Ingredient | Weight % | Purpose of the Mixture |
| --- | --- | --- |
| Natural rubber | 10 | polymer component |
| Boron Nitride Powder | 30 | filler material |
| Bareco SCS050 | 20 | melting point component |
| Toluene | 30 | solvent |
| Piccolastic A25 | 10 | melting point component |

This mixture was heated, coated and dried on a release liner, using the method of Example 1.

Example 12

Natural rubber, Bareco SC5050, and boron nitride powder were combined with toluene as follows:

| Ingredient | Weight % | Purpose of the Mixture |
|---|---|---|
| Natural rubber | 20 | polymer component |
| Boron Nitride Powder | 40 | filler material |
| Bareco SC5050 | 10 | melting point component |
| Toluene | 30 | solvent |

This mixture was heated, coated and dried on a release liner, using the method of Example 1.

Example 13

Kraton 1107, Bareco SC5050, Piccolastic A50, and Boron Nitride were combined with toluene as follows:

| Ingredient | Weight % | Purpose of the Mixture |
|---|---|---|
| Kraton 1107 | 10 | polymer component |
| Boron Nitride Powder | 30 | filler material |
| Bareco SC5050 | 20 | melting point component |
| Toluene | 30 | solvent |
| Piccolastic A50 | 10 | melting point component |

This mixture was heated, coated and dried on a release liner, using the method of Example 1.

Example 14

Kraton 1102, Bareco SC5050, Piccolastic A50, and boron nitride were combined as follows:

| Ingredient | Weight % | Purpose of the Mixture |
|---|---|---|
| Kraton 1102 | 10 | polymer component |
| Boron Nitride Powder | 30 | filler material |
| Bareco SC5050 |  | melting point component |
| Toluene | 30 | solvent |
| Piccolastic A50 | 10 | melting point component |

This mixture was heated, coated and dried on a release liner, using the method of Example 1.

Example 15

Kraton 1652, Bareco SC5050, Piccolastic A50, and boron nitride were combined with toluene as follows:

| Ingredient | Weight % | Purpose of the Mixture |
|---|---|---|
| Kraton 1652 | 10 | polymer component |
| Boron Nitride Powder | 30 | filler material |
| Bareco SC5050 | 20 | melting point component |
| Toluene | 30 | solvent |
| Piccolastic A50 | 10 | melting point component |

This mixture was heated, coated and dried on a release liner, using the method of Example 1.

Example 16

Kraton 1107, Bareco SC5050, and Boron Nitride were combined with toluene as follows:

| Ingredient | Weight % | Purpose of the Mixture |
|---|---|---|
| Kraton 1107 | 10 | polymer component |
| Boron Nitride Powder | 30 | filler material |
| Bareco SC5050 | 20 | melting point component |
| Toluene | 30 | solvent |

This mixture was heated, coated and dried on a release liner, using the method of Example 1.

Example 17

Natural Rubber, Bareco SC5050, and alumina powder were combined with toluene as follows:

| Ingredient | Weight % | Purpose of the Mixture |
|---|---|---|
| Natural rubber | 10 | polymer component |
| Alumina | 30 | filler material |
| Bareco SC5050 | 20 | melting point component |
| Toluene | 40 | solvent |

This mixture was heated, coated and dried on a release liner, using the method of Example 1.

Example 18

Ashland adhesive, Aeroset 1081, Lorol $C_{16}$ (cetyl alcohol), isopropyl alcohol, boron nitride, Irganox 330 (an antioxidant, obtained from Ciba Geigy), Irganox 1010 (an antioxidant, obtained from Ciba Geigy), KR38S (a wetting agent, obtained from Kendrich), and pigments (for aesthetic purposes), were combined in a mixture as listed below with toluene at the following ratios:

| Ingredient | Weight Percent |
|---|---|
| Irganox 330 | 0.32% |
| Boron Nitride | 23.76% |
| Isopropyl Alcohol | 22.45% |
| Irganox 1010 | 0.32% |
| KR 38S | 0.24% |
| Toluene | 4.82% |
| Pigment Red (UDC Red) | 0.08% |
| Pigment Yellow (UDC yellow) | 0.48% |
| Cetyl Alcohol | 17.11% |
| Cetyl Alcohol | 9.51% |
| Aeroset Adhesive 1081 Adhesive 1081 | 20.91 |

This mixture was heated to 50° C. and mixed until a homogeneous solution developed. The cetyl alcohol was added in two stages, although the total amount may also be added at one time. The solution was then coated onto a paper previously coated with a silicone release film. The coating was dried at 100° C. for 5 minutes. The dry thickness was 0.003" thick. The thermal interface material thus formed was removed from the liner and tested in an Anter "Unitherm™" thermal test apparatus, model 2021 SX67 according to ASTM D1530. The thermal resistance of the sample was 0.03° C.-in$^2$/W. Thermal conductivity was 1.2 W-M/K.

Example 19

Aeroset 1081, Lorol C16 alcohol, and boron nitride were combined in a mixture with other ingredients and toluene at the following ratios:

| Component | Percent of total |
|---|---|
| Aeroset 1081 | 20.973 |
| Isopropyl alcohol | 22.523 |
| Toluene | 4.493 |
| Boron Nitride | 23.84 |
| Cetyl Alcohol | 26.697 |
| Irganox 330 | 0.323 |
| Irganox 1010 | 0.323 |
| KR38S | 0.27 |
| UCD Yellow | 0.476 |
| UCD Red | 0.081 |

The mixture was heated to 50° C. and mixed until homogeneous. This solution was then coated onto a liner paper coated with silicone release. This was dried at 100° C. for 5 minutes. The dry thickness was 0.003" thick. The thermal interface material was removed from the liner and tested in an Anter "Unitherm™" thermal test apparatus, model 2021 SX67 according to ASTM D1530. The thermal resistance of the sample was 0.03° C.-in$^2$/W. Thermal conductivity was 1.2 W-M/K.

Example 20

An adhesive (Dow PSA 750D1) was coated onto a liner sheet (Furon product number 9022) at 0.0003" thick. The PSA coated liner was then laminated to a sheet of woven fiberglass as a reinforcing material (Product #106 from BGF industries). A liner sheet with a thermal interface material was prepared according to the method of Example 19. Then the polymeric coated sheet of Example 19 and the fiberglass laminated with the PSA coated liner were heated and laminated together at 130° F. to provide a multiple layer strip in the following order:

Furon liner sheet,
PSA adhesive,
fiberglass sheet,
thermal interface material, and
release-coated liner.

The thermal interface material laminated to glass cloth (fiberglass) was removed from the two liner sheets and tested in an Anter "Unitherm™" thermal test apparatus, model 2021 SX67 according to ASTM D1530. The thermal resistance of the sample was 0.04° C.-in$^2$/W. Thermal conductivity was 1.1 W-M/K.

Example 21

An adhesive (Dow PSA 750D1) was coated onto a liner (Furon product number 9022) at 0.0003" thick. The PSA coated sheet was then laminated to fiberglass (fiberglass #106 from BGF industries). A liner sheet coated with thermal interface material was prepared according to the method of Example 19. Then, the polymeric coated sheet of Example 19 and fiberglass laminated with the PSA coated liner were heated and laminated together at 130° F. The thermal interface material laminated to glass cloth was removed from the liners and tested in an Anter "Unitherm™" thermal test apparatus, model 2021 SX67 according to ASTM D1530. The thermal resistance of the sample was 0.04° C.-in$^2$/W. Thermal conductivity was 1.1 W-M/K.

Example 22

An adhesive (Dow PSA 6574) was coated onto a liner (Furon product number 9022) at 0.0003" thick. The PSA coated sheet was then laminated to fiberglass (fiberglass #106 from BGF industries). A liner sheet coated with thermal interface material was prepared according to the method of Example 19. Then, the polymeric coated sheet of Example 19 and fiberglass laminated with the PSA coated liner were heated and laminated together at 130° F. The thermal interface material laminated to glass cloth was removed from the liners and tested in an Anter "Unitherm™" thermal test apparatus, model 2021 SX67 according to ASTM D1530. The thermal resistance of the sample was 0.04° C.-in$^2$/W. Thermal conductivity was 1.1 W-M/K.

Example 23

An adhesive (Dow PSA 6574) was coated onto a liner (Furon product number 750D1) at 0.0003" thick. The PSA coated sheet was then laminated to 0.002" thick aluminum foil. A liner sheet with thermal interface material was prepared according to the method of Example 19. Then, the polymeric coated sheet of Example 19 and aluminum foil laminated with the PSA coated liner were heated and laminated together at 130° F. The thermal interface material laminated to glass cloth was removed from the liners and tested in an Anter "Unitherm™" thermal test apparatus, model 2021 SX67 according to ASTM D1530. The thermal resistance of the sample was 0.025° C.-in$^2$/W. Thermal conductivity was 1.5 W-M/K.

Example 24

An adhesive (Ashland 414) was coated onto a liner (Furon liner product number 1018) at 0.0002" thick. The adhesive coated liner was then laminated to fiberglass (fiberglass #106 from BGF industries). A liner sheet coated with thermal interface material was prepared according to the method of Example 19. Then, the polymeric coated sheet of Example 19 and fiberglass laminated with the PSA coated liner were heated and laminated together at 130° F. The thermal interface material laminated to glass cloth was removed from the liners and tested in an Anter "Unitherm™" thermal test apparatus, model 2021 SX67 according to ASTM D1530. The thermal resistance of the sample was 0.04° C.-in$^2$/W. Thermal conductivity was 1.1 W-M/K.

Example 25

The films produced in examples 1–17 were tested for chemical and physical properties. Table 1 summarizes the properties for each of the examples. As can be seen from Table 1, the melting point of the file can be adjusted by selecting the components of the melting component. Thermal impedance and thermal conductivity were measured on liner free samples of the film using Anter "Unitherm™" thermal test apparatus, model 2021 SX67, according to ASTM D1530. Differential Scanning Calorimetry (DSC) was used to determine the melting point of the compound.

| Example | Melting Point DSC °C. | Thermal Impedance (°C. in²/W) | Thermal Conductivity (W-m/K) | Thermal Resistance Pentium Pro (°C./W) | DMA Viscosity @ 100°C. (Pa · S) | Solubility Parameter Wax δ | Solubility Parameter Polymer δ |
|---|---|---|---|---|---|---|---|
| 1 | 58 | .07 | 0.8 | 0.30 |  | 10.1 | 10.5 |
| 2 | 58 | .08 | 0.8 | 0.28 | 50 | 10.1 | 10.5 |
| 3 | 58 | .07 | 0.8 | 0.22 |  | 10.1 | 10.5 |
| 4 | 58 | .07 | 0.7 | 0.29 |  | 10.1 | 10.5 |
| 5 | 50 | .07 | 0.8 | 0.21 | 15 | 10.7 | 10.5 |
| 6 | 40 | .07 | 0.8 | 0.19 | 10 | 10.5 | 10.5 |
| 7 | 60 | .07 | 0.8 | 0.27 |  | 10.5 | 10.5 |
| 8 | 58 | .07 | 0.8 | 0.30 |  | 10.4 | 10.5 |
| 9 | 45 | .07 | 0.8 | 0.35 |  | 7.4 | 7.4 |
| 10 | 45 | .10 | 0.5 | 0.33 |  | 7.4 | 7.4 |
| 11 | 45 | .07 | 0.8 | 0.33 |  | 7.4 | 7.4 |
| 12 | 45 | .07 | 1.4 | 0.34 |  | 7.4 | 7.4 |
| 13 | 47 | .07 | 0.8 | 0.30 |  | 7.4 | 7.4 |
| 14 | 47 | .07 | 0.8 | 0.28 |  | 7.4 | 7.4 |
| 15 | 47 | .07 | 0.8 | 0.27 |  | 7.4 | 7.4 |
| 16 | 45 | .07 | 0.8 | 0.29 |  | 7.4 | 7.4 |
| 17 | 45 | .07 | 0.8 | 0.35 |  | 7.4 | 7.4 |

Example 26

Mounting pressure for various films was calculated using the following formula:

$$P = \frac{T \times N}{0.2 \times D \times A}$$

where

N=Number of fasteners

D=Fastener diameter (inches)

A=Surface contact area (sq. in.)

Figure 7:
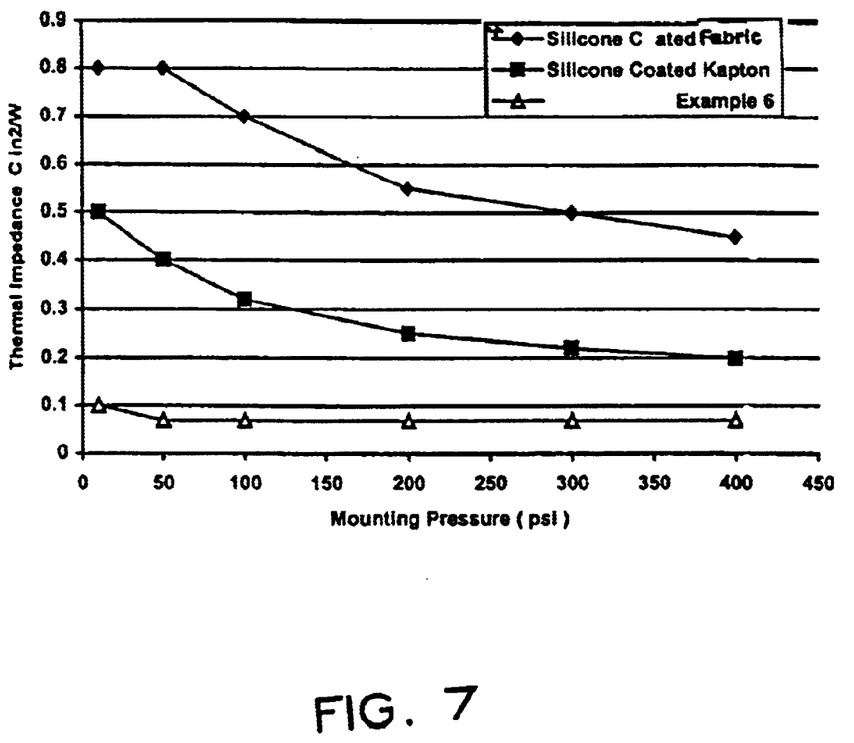
FIG. 7 is a plot of thermal impedance versus mounting pressure for three interface materials.

FIG. 7 shows a plot of thermal impedance versus the mounting pressure for three different materials. The first two are a silicone coated fabric using Bergquist SP 400, a silicone coated polyimide (Kapton®, prepared according to U.S. Pat. No. 4,574,879 and the third is the film of Example 6 of this application. As can be seen from FIG. 7, the film of Example 6 has low thermal impedance over the entire range of mounting pressures.

The invention has been described with reference to the preferred embodiments. It should be apparent that modifications and alterations will occur to others upon a reading and understanding of the preceding specification. It is intended that the invention be construed as including all such alterations and modifications insofar as they come within the scope of the appended claims or the equivalents thereof.

Having thus described the preferred embodiments, the invention is now claimed to be:

1. A multi-layer strip comprising:
 a first layer of a thermal interface material for thermally connecting a heat source with a heat sink, including:
  a polymer component,
  a melting point component mixed with the polymer component in sufficient quantity to adjust the softening temperature of the interface material to about the operating temperature of the heat source, the melting point component melting and dissolving the polymer component in the melting point component, and
  a thermally conductive filler mixed with the melting point component and the polymer component; and
 a second layer disposed on a side of the thermal interface material, the second layer including at least one of:
  a protective releasable liner, and
  a layer of an adhesive material.

2. The multi-layer strip of claim 1, wherein the second layer includes a protective releasable liner and the strip further comprises:
 a layer of an adhesive material disposed on a second side of the thermal interface material.

3. The multi-layer strip of claim 2, further including:
 a second protective release liner disposed on the layer adhesive material.

4. The multi-layer strip of claim 1, further including a reinforcing material in contact with the interface material.

5. The multi-layer strip of claim 4, wherein the reinforcing material is selected from the group consisting of fiberglass and aluminum foil.

6. The multi-layer strip of claim 1, wherein the protective liner includes a substrate coated with a release coating.

7. A method of providing a thermal interface between a heat source and a heat sink, the method comprising:
 interposing a thermal interface material between the heat source and heat sink which softens at about the operating temperature of the heat source to provide a thermal interface between the heat source and the heat sink during operation of the heat source, the thermal interface material including:
  a polymer component,
  a melting component for modifying the temperature at which the thermal interface material softens, the melting point component melting and dissolving the polymer component in the melting point component, and
  a thermally conductive filler mixed with the polymer component and the melting point component.

8. The method of claim 7, further including:
 adhering the thermal interface material to one of the heat source and the heat sink by application of heat.

9. The method of claim 7, further including:
 adhering the thermal interface material to one of the heat source and the heat sink with a layer of an adhesive material.

10. The multi-layer strip of claim 1, wherein the melting point component is a $C_{12}$–$C_{16}$ alcohol or acid selected from the group consisting of myristyl alcohol, cetyl alcohol, stearyl alcohol, myristyl acid, stearic acid, and combinations thereof.

11. A multi-layer strip comprising:
a first layer of a thermal interface material for thermally connecting a heat source with a heat sink, including:
a polymer component,
a melting point component mixed with the polymer component which modifies the temperature at which the phase change substance softens, the melting point component being selected from the group consisting of $C_{12}$–$C_{16}$ alcohols, acids, esters, petroleum waxes, wax-like compounds, low molecular weight styrenes, methyl triphenyl silane materials, and combinations thereof; and
a second layer disposed on a side of the thermal interface material, the second layer including at least one of:
a protective releasable liner, and
a layer of an adhesive material.

12. The multi-layer strip of claim 10, wherein the polymer component includes an elastomer selected from the group consisting of silicone, acrylic polymers, natural rubber, synthetic rubber, and combinations thereof.

13. A method of providing a thermal interface between a heat source and a heat sink, the method comprising:
interposing a thermal interface material between the heat source and heat sink which softens at about the operating temperature of the heat source to provide a thermal interface between the heat source and the heat sink during operation of the heat source, the thermal interface material including:
a polymer component,
a melting component for modifying the temperature at which the thermal interface material softens, the melting point component being selected from the group consisting of $C_{12}$–$C_{16}$ alcohols, acids, esters, petroleum waxes, wax-like compounds, low molecular weight styrenes, methyl triphenyl silane materials, and combinations thereof; and
a thermally conductive filler mixed with the polymer component and the melting point component.

14. The method of claim 13, wherein the polymer component includes an elastomer selected from the group consisting of silicone, acrylic polymers, natural rubber, synthetic rubber, and combinations thereof.

15. The method of claim 13, wherein the melting point component is a wax or a waxlike compound selected from the group consisting of microcrystalline wax, paraffin waxes, cyclopentane, heceicosyl, 2-heptadecanone, pentacosaneyl, silicic acid, tetraphenyl ester, octadecanoic acid, 2-[2-[2-(2hydroxyethoxy)ethoxy]ethoxy]ethyl ester, cyclohexane docosyl, polystyrene, polyamide resins, disiloxane 1,1,1,trimethyl-3,3, triphenyl silane, and combinations thereof.

16. A multi-layer strip comprising:
a first layer of a thermal interface material for thermally connecting a heat source with a heat sink, including;
a polymer component,
a melting point component mixed with the polymer component which modifies the temperature at which the thermal interface material softens, the polymer component having a solubility parameter which is within +1 and −1 of the solubility parameter of the melting point component; and
a second layer disposed on a side of the thermal interface material, the second layer including at least one of:
a protective releasable liner, and
a layer of an adhesive material.

17. A method of forming a thermal interface product comprising:
forming a thermal interface material by combining a polymer component with a thermally conductive filler and a melting component for modifying the temperature at which the thermal interface material softens; and
supporting a layer of the thermal interface material on a release liner; and
providing a layer of adhesive on one side of the layer.

18. The method of claim 17, wherein the polymer component includes an elastomer selected from the group consisting of silicone, acrylic polymers, natural rubber, synthetic rubber, and combinations thereof.

19. The method of claim 17, wherein the melting point component is a $C_{12}$–$C_{16}$ alcohol or acid selected from the group consisting of myristyl alcohol, cetyl alcohol, stearyl alcohol, myristyl acid, stearic acid, and combinations thereof.

* * * * *